United States Patent [19]

Lin

[11] Patent Number: 5,066,366

[45] Date of Patent: Nov. 19, 1991

[54] METHOD FOR MAKING FOIL

[75] Inventor: Lifun Lin, Hamden, Conn.

[73] Assignee: Olin Corporation, Cheshire, Conn.

[21] Appl. No.: 519,529

[22] Filed: May 4, 1990

[51] Int. Cl.$^5$ ............................................... C25D 1/04
[52] U.S. Cl. ...................................................... 204/12
[58] Field of Search ..................................... 204/12, 13

[56] References Cited

U.S. PATENT DOCUMENTS

| | | | |
|---|---|---|---|
| 3,886,022 | 5/1975 | Konicek | 156/247 |
| 3,936,548 | 2/1976 | Konicek | 427/405 |
| 4,088,544 | 5/1978 | Hutkin | 204/12 |
| 4,113,576 | 9/1978 | Hutkin | 204/13 |
| 4,234,395 | 11/1980 | Berdan et al. | 204/12 |
| 4,323,632 | 4/1982 | Berdan et al. | 428/626 |
| 4,468,293 | 8/1984 | Polan et al. | 204/27 |
| 4,529,486 | 7/1985 | Polan | 204/13 |
| 4,532,014 | 7/1985 | Polan et al. | 204/28 |
| 4,549,950 | 10/1985 | Polan et al. | 204/206 |
| 4,568,431 | 2/1986 | Polan et al. | 204/13 |

*Primary Examiner*—T. M. Tufariello
*Attorney, Agent, or Firm*—H. Samuel Kieser

[57] ABSTRACT

A process for making ultra-thin foil utilizing a copper or copper alloy foil carrier. The foil carrier is pretreated prior to the deposition of the ultra-thin layer of copper or copper alloy thereon. The pretreatment includes cleaning the carrier by treatment with an aqueous acid solution preferably containing an oxidizer, rinsing the carrier and then treating the carrier with an aqueous solution of chromic acid and phosphoric acid to apply a film to the carrier.

16 Claims, No Drawings

METHOD FOR MAKING FOIL

BACKGROUND OF THE INVENTION

1. Field of the Invention

This invention relates generally to the making of copper and copper alloy foil and more particularly, to the making of ultra-thin foil using a copper or copper alloy carrier.

2. Background Information

Copper foil has been widely used for many years in the manufacture of printed circuits. The raw material for printed circuits usually consists of a laminate of a copper foil and a resinous substrate. In recent years, it has been found desirable to make such laminates for printed circuits using copper foil that is much thinner than formerly used. Ultra-thin foils of thicknesses of less than 18 microns (0.5 ounces per square foot) and on the order of 5-9 microns are now being used. One reason for the use of thinner foil is the demand for printed circuits with good dimensional precision, especially in circuitry with narrow width lines and short distances between the conductors. With the use of thinner copper foils, decrease of the so called "undercut" is obtained. By undercut is meant the elimination of copper under the etch resist caused by the etching solution which while dissolving the unprotected portions of the copper layer also eats into the copper covered by the etch resist.

Further, there is also a desire to reduce the amount of copper removed by the etching process which forms the circuit conductor pattern so as to reduce the cost of etchant as well as reducing copper recovery costs, or alternatively, a reduction of copper loss if no such recovery is effected.

When copper foil is made by itself in thicknesses of less than 0.5 ounce per square foot or less, it becomes very difficult to handle. During processing it often wrinkles and tears unless extreme care is exercised. Thus, according to current practice, the desired ultra-thin copper foil layer is conventionally formed on a temporary carrier surface of aluminum. The foil is then laminated onto an insulating support such as a glass fiber reinforced epoxy resin. Thereafter, the temporary carrier is removed, either by mechanically peeling the carrier off, or chemically by etching it off, leaving a copper foil surface on the support. The copper foil may then be etched or otherwise treated to produce the electrical circuit. Examples of making thin copper foil supported on an aluminum alloy substrate are described in U.S. Pat. Nos. 3,886,022; 3,936,548; 4,088,544; 4,113,576; 4,234,395; and 4,323,632.

SUMMARY OF THE INVENTION

The present invention is directed to the use of copper or copper alloy foil as the carrier for making thin copper foil. As compared to aluminum, copper foil has better mechanical strength and as a result, the composite sheet will be less likely to rip or tear. Further, in order to obtain uniform plating of the copper on the disposable aluminum foil carrier, special surface treatment such as etching of the aluminum foil is required. Additionally, the use of aluminum foil as a carrier presents recycling problems. The aluminum is relatively soft and is generally not removed as a usable strip. Generally, the copper foil manufacturers are not equipped to reuse aluminum. On the other hand, if copper is used as the carrier, the foil maker can either reuse the peeled strip, or reclaim the copper for use as scrap material for use in the deposition process.

If the copper foil carrier is made by an electrodeposition process, the surface finish can be controlled. The condition of the surface of the carrier is important because the ultra-thin foil will mirror the surface of the carrier.

In accordance with the present invention, the copper or copper alloy foil is pretreated in order to render it strippable from the thin layer of foil which is deposited thereon. The pretreatment process includes cleaning the surface of the carrier foil and thereafter treating the foil with an aqueous solution of chromic and phosphoric acid to apply a film to the foil which will render a subsequent deposit of copper or copper alloy on the foil strippable therefrom. The foil may then be used as the carrier for thin foil deposition.

DESCRIPTION OF THE PREFERRED EMBODIMENT

More specifically, the present invention contemplates the use of a copper or copper alloy foil as a carrier for this foil deposition. The copper or copper alloy foil carrier may be either wrought foil or electrodeposited foil and may have a thickness of 18 microns or greater. The thickness of the foil should be such as to provide the mechanical strength necessary to support the ultra-thin layer to be deposited thereon. Foil in the conventional one ounce (35 microns) thickness is preferred.

In the case of electrodeposited foil to be used as the carrier, such foil may be produced according to any of the methods disclosed and with any of the apparatus shown in U.S. Pat. Nos. 4,529,486; 4,532,014; 4,549,950; and 4,568,431. In general, such an electrodeposition system for producing a copper or copper alloy foil comprises a plating tank designed to hold an electrolyte. A rotating metal drum is connected to a negative terminal of a direct current power supply and serves as the cathode. An anode of arcuate shape is connected to the positive terminal of the power supply and is mounted in the tank in such a way that a substantial uniform inner-electrogap is formed with the drum cathode. An electrolyte solution is present within the tank and generally comprises an aqueous solution containing a concentration of metal ions to be deposited on the cathode plating surface of the rotating drum. For the production of copper foil, it would contain a concentration of copper ions. Preferably, such electrolyte solution comprises a copper sulfate-sulfuric acid solution. The compositional specifics of a copper sulfate-sulfuric acid solution and the temperature ranges with which it may be used are more fully described in the Polan et al, U.S. Pat. No. 4,529,486. When a current is applied, metal is deposited on the rotating drum. The metal deposit generally takes the form of a relatively thin, relatively smooth continuous strip of metal foil which is removed from the drum plating surface after it immerges from the electrolyte.

The foil constituting the carrier is preferably cleaned prior to undergoing treatment. Any suitable cleaning process may be used to remove oxides and contaminants from the foil. In general, the cleaning process may include treatment of the surfaces of the carrier foil with an aqueous acidic solution which may contain an oxidizer. Any suitable acid may be used which is capable of cleaning the foil and which does not have a deleterious effect on the foil and does not present environmental problems. Preferred acids include $H_2SO_4$ and $HNO_3$ and suitable oxidizers include $Na_2S_2O_8$ and $H_2O_2$. When $HNO_3$ is used, a separate oxidizer ingredient may be omitted as the $HNO_3$ is an oxidizer.

Concentration of the solution may vary according to the components being used. For example, when $H_2SO_4$ is used with $Na_2S_2O_8$, the solution may containing from about 1 to about 5 volume percent of $H_2SO_4$ and about 10 to about 30 weight percent of the $Na_2S_2O_8$. In the case of solutions of $H_2SO_4$ and $H_2O_2$, concentrations of from about 10 to about 20 volume percent $H_2SO_4$ and from about 1 to 3 volume percent $H_2O_2$ may be used. When an aqueous solution of nitric acid is used, its concentration may be from about 1.0 to 30 volume percent.

While the cleaning solution may be applied in any appropriate manner such as by dipping or spraying, it is preferred that the foil be immersed in a tank containing the cleaning solution. The time of the immersion of the foil in the solution may be from about 5 to about 20 seconds. The cleaning process may be carried out at any desired temperature though it is preferred that the solution be maintained at an ambient temperature.

After the cleaning treatment, the foil is rinsed to remove any loose particles on the foil and wash away any unwanted chemicals left during the cleaning treatment. Such rinsing may be achieved by using spray nozzles to spray ionized water on both sides of the foil. Alternatively, the rinsing may be achieved by using a tank containing the rinse solution and through which the foil is passed.

After cleaning and water rinsing, the foil is treated with a chromic acid-phosphoric acid solution to apply a film to the foil. Solutions which may be used in accordance with the present invention contain chromic acid in a concentration of about 0.002 grams per liter to about 3.0 grams per liter and phosphoric acid in a concentration in the range of about 0.002 grams per liter to about 3.0 gram per liter. Generally this solution contains no other constituents besides water and some minor impurities. The preferred embodiment of the solution may consist essentially of from 0.1 grams per liter to about 0.5 grams per liter of chromic acid, from about 0.1 grams per liter to about 1.0 gram per liter of phosphoric acid and the balance essentially water.

It is preferred that the chromic acid-phosphoric acid solution treatment be applied by immersing the foil in a tank containing the phosphoric-chromic acid solution. The treatment of the foil may be applied with the phosphoric-chromic acid solution at any desired temperature although it is preferred that the solution be maintained at a temperature in the range of from about 20° C. to about 100° C.

It is also preferred to keep the foil immersed in the solution for a time in the range of from about 3 seconds to about 3 minutes and most preferably from about 20 seconds to about 60 seconds. When other techniques such as spraying are used to apply the treatment, the foil should be exposed to the solution for similar time periods.

After immersion of the foil carrier in chromic acid-phosphoric acid solution, the carrier may be rinsed with $H_2O$ or preferably a dilute caustic solution may be applied. This step may be omitted depending upon the concentration of the chromic acid-phosphoric acid solution. If a dilute caustic solution is used, such solution may comprise an aqueous solution having a pH of at least about 8. Solutions of particular benefits are those having a pH in the range of about 9 to 11.5. Any suitable addition agent may be employed to adjust the pH of this solution. Generally, the addition will be selected from the group consisting of the salts of alkali metals, the salts of alkaline earth metals, the hydroxides of the alkali metals, and the hydroxides of the alkaline earth metals. A preferred addition agent is one selected from a group consisting of sodium hydroxide, calcium hydroxide, potassium hydroxide, and ammonium hydroxide. While the amount of addition agent present in the solution will be a function of the desired pH level for the solution, generally the addition agent will be present in the concentration of greater than 1 ppm, and preferably about 50 ppm.

The temperature of the basic solution may be maintained at a temperature in the range of from about room temperature to about 100° C. While the time of immersion in the basic solution may vary from about 1 second to about 120 seconds, most preferably, it is immersed for about 5 seconds to about 30 seconds.

The foil may then be dried and is ready for use as a carrier for thin foil deposition. If it is desired to dry the foil, such drying may be accomplished by any suitable method. Numerous drying processes are known in the art. One such process which may be used embodies a water blow-off stage followed by a hot-air tunnel drying stage. An alternative process which may be used utilizes heat as well as air for both bulk and evaporative water removal. In this latter process, the hot air can be directed against the foil when it is lying on drum rollers in the processing line. In still another alternative process, at least one internally heated drum roller or infrared heating may be used to dry the foil.

As mentioned, after the above-described treatment, the foil is ready to be used as a carrier for depositing ultra-thin foil. The thin foil may be deposited on the copper carrier by either D.C. plating or pulse plating, both of which are well known in the art. In both processes, the foil is immersed in electrolyte containing a source of copper ions and an electric current is passed through the foil and an anode to cause the electrodeposition of the copper on the foil.

To show the feasibility of such process, a one ounce ED foil was cleaned in an aqueous solution containing 1 volume percent $H_2SO_4$ and 20 weight percent $Na_2S_2O_8$ for 30 seconds followed by an $H_2O$ rinse. The foil was then immersed in a chromic acid-phosphoric acid solution for 30 seconds at 60° C. The concentration of the solution was 0.2 grams per liter chromic acid and 0.5 grams per liter phosphoric acid. The foil was then dried and a copper nodule layer was deposited on this treated ED foil utilizing a process of the type disclosed in U.S. Pat. No. 4,468,293 to Polan et al which uses a current having regularly recurring pulses. In this process copper dendrites are formed on the surface of the copper foil during a first portion of each pulse and are bonded to the surface during the second portion of each pulse. The resulting deposited foil had its free surface laminated to an FR-4 substrate. It was found that the nodule layer was easily separated from the ED foil carrier member after lamination. The peel strength of the foil was 1.6 lbs/in as determined by specification IPC 2.4.8 of the Institute for Interconnecting and Packaging Electronic Circuits.

While the invention has been described above with reference to specific embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A process for making ultra-thin foil comprising:
   providing a copper or copper alloy foil carrier,
   cleaning said carrier,
   thereafter treating said carrier with an aqueous solution of chromic acid and phosphoric acid to apply a film on said carrier to render a subsequent deposit of copper or copper alloy foil thereon to be strippable therefrom, and
   depositing on said carrier an ultra-thin layer of copper or copper alloy.

2. The process of claim 1 wherein said cleaning step comprises cleaning with an aqueous acidic acid solution containing an oxidizer.

3. The process of claim 2 wherein said cleaning step comprises treating said foil with an aqueous solution containing $H_2SO_4$ and $Na_2S_2O_8$.

4. The process of claim 2 wherein said cleaning step comprises treating said foil with an aqueous solution of $H_2SO_4$ and $H_2O_2$.

5. The process of claim 1 wherein said cleaning step includes treating said foil with an aqueous solution of $HNO_3$ acid.

6. The process of claim 2 wherein the concentration of said chromic acid and phosphoric acid is in the range of from about 0.002 to about 3.0 g/l chromic acid and from about 0.002 to about 3.0 g/l phosphoric acid.

7. The process of claim 5 wherein the concentration of said aqueous solution of chromic acid and phosphoric acid is from about 0.1 to about 0.5 grams per liter chromic acid and from about 0.1 to about 1.0 grams per liter phosphoric acid.

8. The process of claim 1 further including drying said carrier after said treatment with said aqueous solution of chromic acid and phosphoric acid.

9. The process of claim 1 further including rinsing said carrier in an aqueous caustic solution having a pH greater than 8 after said treatment with said aqueous solution of chromic acid and phosphoric acid.

10. The process of claim 9 wherein said caustic solution has a pH in the range of about 9 to about 11.5 and temperature in the range of about room temperature to about 100° C.

11. The process of claim 9 wherein said caustic solution contains a material selected from the group consisting of the salts of alkali metals, the salts of alkaline earth metals, the hydroxides of the alkali metals, and the hydroxides of the alkaline earth metals.

12. The process of claim 11 wherein said caustic solution contains at least 1 ppm of a material selected from the group consisting of calcium hydroxide, sodium hydroxide, potassium hydroxide, and ammonium hydroxide.

13. A process for treating a copper or copper alloy foil carrier for use in the depositing of ultra-thin copper or copper alloy films thereon comprising:
    cleaning said carrier by treatment with an aqueous acidic solution,
    rinsing said carrier, and
    treating said carrier with an aqueous solution of chromic acid and phosphoric acid to provide a film thereon to render a subsequent deposit of copper or copper alloy foil thereon to be strippable therefrom.

14. The process of claim 13 wherein the concentration of the aqueous solution of chromic acid and phosphoric acid is in the range of from about 0.002 to about 3.0 grams per liter chromate acid and from about 0.002 to about 3.0 grams per liter phosphoric acid.

15. The process of claim 13 wherein the concentration of said aqueous solution of chromic acid and phosphoric acid is from about 0.1 to about 0.5 grams per liter chromic acid and from about 0.1 to about 1.0 grams per liter phosphoric acid.

16. The process of claim 13 further including rinsing said carrier in an aqueous caustic solution having a pH greater than 8 after said treatment with said aqueous solution of chromic acid phosphoric acid.

* * * * *